(12) United States Patent
Babayan et al.

(10) Patent No.: US 6,194,036 B1
(45) Date of Patent: Feb. 27, 2001

(54) DEPOSITION OF COATINGS USING AN ATMOSPHERIC PRESSURE PLASMA JET

(75) Inventors: Steve E. Babayan, Huntington Beach, CA (US); Gary S. Selwyn, Santa Fe, NM (US); Robert F. Hicks, Los Angeles, CA (US)

(73) Assignee: The Regents of the University of California, Los Alamos, NM (US)

( * ) Notice: Subject to any disclaimer, the term of this patent is extended or adjusted under 35 U.S.C. 154(b) by 0 days.

(21) Appl. No.: 09/176,046

(22) Filed: Oct. 20, 1998

Related U.S. Application Data

(60) Provisional application No. 60/062,882, filed on Oct. 20, 1997.

(51) Int. Cl.$^7$ .................................................. C23C 16/513

(52) U.S. Cl. ........................... 427/563; 427/579; 427/580

(58) Field of Search ..................................... 427/563, 579, 427/580

(56) References Cited

U.S. PATENT DOCUMENTS 5,807,614 * 9/1998 Sindzingre et al. .................. 427/540

OTHER PUBLICATIONS

S. E. Babayan et al., "Deposition of Silicon Dioxide Films with an Atmospheric–Pressure Plasma Jet," Plasma Sources Sci. Technol. 7, 286 (Aug. 1998).

* cited by examiner

*Primary Examiner*—Timothy Meeks
(74) *Attorney, Agent, or Firm*—Samuel M. Freund

(57) ABSTRACT

Deposition of coatings using an atmospheric pressure plasma jet. The use of a nonthermal source which is capable of operation at 760 torr is demonstrated. As an example of the application of the present invention, a helium/oxygen gas mixture is introduced into the annular region between two coaxial electrodes driven by a 13.56 MHz radio frequency (rf) source at between 40 and 500 W to produce a stable plasma jet. Silicon dioxide films are deposited by introducing tetraethoxysilane (TEOS) into the effluent stream. A deposition rate of 3020±250 Å/min. is achieved with an rf power of 400 W, 0.2 torr of TEOS, 11.1 torr of oxygen, 748.7 torr of helium, and a total gas flow rate of 41 L/min. The deposition rate depends on the oxygen partial pressure, the TEOS partial pressure, and the rf power to the 0.28, 0.47, and 1.41 powers, respectively. However, increasing the temperature decreases the deposition rate. The observed dielectric constants of the films decrease from 5.0±0.2 to 3.81±0.03 as the deposition temperature increases from 115 to 350° C. Infrared spectra of the deposited films at 350° C. show no carbon or hydroxyl ion contamination, indicating excellent material purity.

6 Claims, 8 Drawing Sheets

(a)

(b)

DEPOSITION OF COATINGS USING AN ATMOSPHERIC PRESSURE PLASMA JET

This patent application claims priority from Provisional Patent Application Ser. No. 60/062,822, filed on Oct. 20, 1997.

FIELD OF THE INVENTION

The present invention relates generally to plasma-enhanced, chemical vapor deposition of coatings and, more particularly, to the use of an atmospheric-pressure, plasma discharge jet for deposition of films on substrates. This invention was made with government support under Contract No. W-7405-ENG-36 awarded by the U.S. Department of Energy to The Regents of the University of California (CULAR UC-Los Alamos National Laboratory Grant). The government has certain rights in the invention.

BACKGROUND OF THE INVENTION

Silicon dioxide is one of the primary materials used in integrated circuit production. Silicon dioxide films are used for interlayer dielectrics and gate oxides for transistors and are presently either grown by thermal oxidation of silicon or deposited by thermal- or plasma-enhanced, chemical vapor deposition. Plasma-enhanced, chemical vapor deposition (PECVD) is often preferred since deposition temperatures are considerably lower than other methods.

The use of silane to deposit silicon dioxide films has been studied in detail. However, PECVD of silicon dioxide using tetraethoxysilane (TEOS) has been found to have several advantages over silane-based CVD processes. Although higher deposition rates are achieved with silane, better conformal coverage of a device is obtained with TEOS due to its lower reactive sticking probability on surfaces (0.045 compared to 0.35 for silane). In addition, TEOS is less hazardous and easier to handle when compared with silane. With the increasing importance of smaller features, step coverage has become an important issue as well. Thus, TEOS has become the primary material for multilevel interconnects in very large-scale, integrated circuit (VLSI) applications. Thermal CVD of silicon dioxide is often carried out with TEOS and ozone. In this process, the deposition is believed to result from the reaction of TEOS and O or $O_3$ in the gas phase. The atomic oxygen is maintained by the decomposition of $O_3$. Plasma-enhanced, chemical vapor deposition of $SiO_2$ is currently performed using TEOS and a reactive oxygen source which contains O atoms or $O_2^+$ ions.

Conventional, low-pressure plasma discharges produce ions and atomic species which may damage underlying layers during the film deposition process. Since atmospheric operation offers certain advantages over vacuum processes, it was decided to explore whether the plasma jet could be used for PECVD of $SiO_2$.

Accordingly, it is an object of the present invention to generate an intense flux of metastable and/or atomic species for use in plasma-enhanced, chemical vapor deposition onto a substrate without exposing the substrate to a significant flux of ionic species.

Another object of the invention is to generate an intense flux of metastable and/or atomic species for use in plasma-enhanced, chemical vapor deposition onto a substrate at atmospheric pressure.

Yet another object of the present invention is to generate an intense flux of metastable and/or atomic species for use in plasma-enhanced, chemical vapor deposition onto a substrate at atmospheric pressure without significantly heating the substrate with the plasma.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects and, in accordance with the purposes of the present invention as embodied and broadly described herein, the method for depositing a material on a substrate hereof may include the steps of: generating reactive species in an arcless, atmospheric-pressure, rf plasma discharge in a gas flowing through an annular or planar region between an electrically conducting chamber having a closed end and an open end and an electrode located within the chamber and disposed such that the annular or planar region is defined therebetween, whereby the reactive species flow toward the open end of the chamber; introducing a gaseous precursor species of the material into the reactive species in the region of the open end of the chamber, the precursor species being chosen such that it reacts with at least one of the reactive species, the reaction products thereof exiting the open end of the chamber as part of a gaseous atmospheric pressure jet; and placing the substrate in the path of the gaseous jet, whereby the reaction products generate a film of the material on the substrate.

Preferably, substantially all ions produced in the atmospheric-pressure, plasma discharge are consumed in the region where the gaseous jet containing the material exits through the open end of the chamber.

In another aspect of the present invention, in accordance with its objects and purposes, the apparatus for depositing a material onto a substrate hereof may include: an electrically conducting chamber having a closed end and an open end; an electrode located within the chamber defining thereby an annular or planar region; means for flowing gases through the annular or planar region; means for supplying rf energy to either of the central electrode or the electrically conducting chamber such that a continuous plasma discharge occurs between the electrode and the chamber, whereby reactive species are generated which flow toward the open end of the chamber; means for introducing a gaseous precursor species of the material into the reactive species in the region of the open end of the chamber, the gaseous precursor species being chosen such that the precursor species reacts with at least one of the reactive species, whereby a gaseous jet capable of forming the material exits through the open end of the chamber.

It is preferred that the central electrode is disposed collinear with the axis of the chamber.

It is also preferred that the electrode has longitudinal slots therein, each slot having a chosen width and a chosen depth.

Preferably also, substantially all ions generated in the atmospheric-pressure, plasma discharge are consumed in the region where the gaseous jet containing the material exits through the open end of the chamber.

Benefits and advantages of the present invention include the generation of an intense beam of the material to be deposited without exposing the substrate to ions and atomic species and to a high-temperature source.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings:

FIG. 7a shows an AFM image of an $SiO_2$ film deposited for 10 min. at 115° C., while FIG. 7b shows an AFM image of an $SiO_2$ film deposited for 10 min. at 350° C.

DETAILED DESCRIPTION OF THE INVENTION

Briefly, the present invention utilizes a plasma discharge sustained at atmospheric pressure and near room temperature to deposit films on substrates. A feed gas containing helium and oxygen is caused to enter the annular region between two coaxial electrodes and produces a stable atmospheric pressure plasma jet (APPJ). The jet differs from conventional low-pressure plasma sources in that it produces an intense flux of metastable and atomic species instead of ionic species. While ions are generated inside the APPJ, they are rapidly consumed by collisions before exiting the space between the electrodes. As an example of the coating process of the present invention, tetraethoxysilane (TEOS), an $SiO_2$ precursor species, is introduced into the flux of helium and oxygen gas discharge products outside of the space between the electrodes, generating thereby a substantial concentration of $SiO_x$ species. These species generate an $SiO_2$ film upon impinging on a silicon substrate. The absence of ions eliminates the possibility of damaging the underlying layer of the substrate during deposition.

Figure 1A:
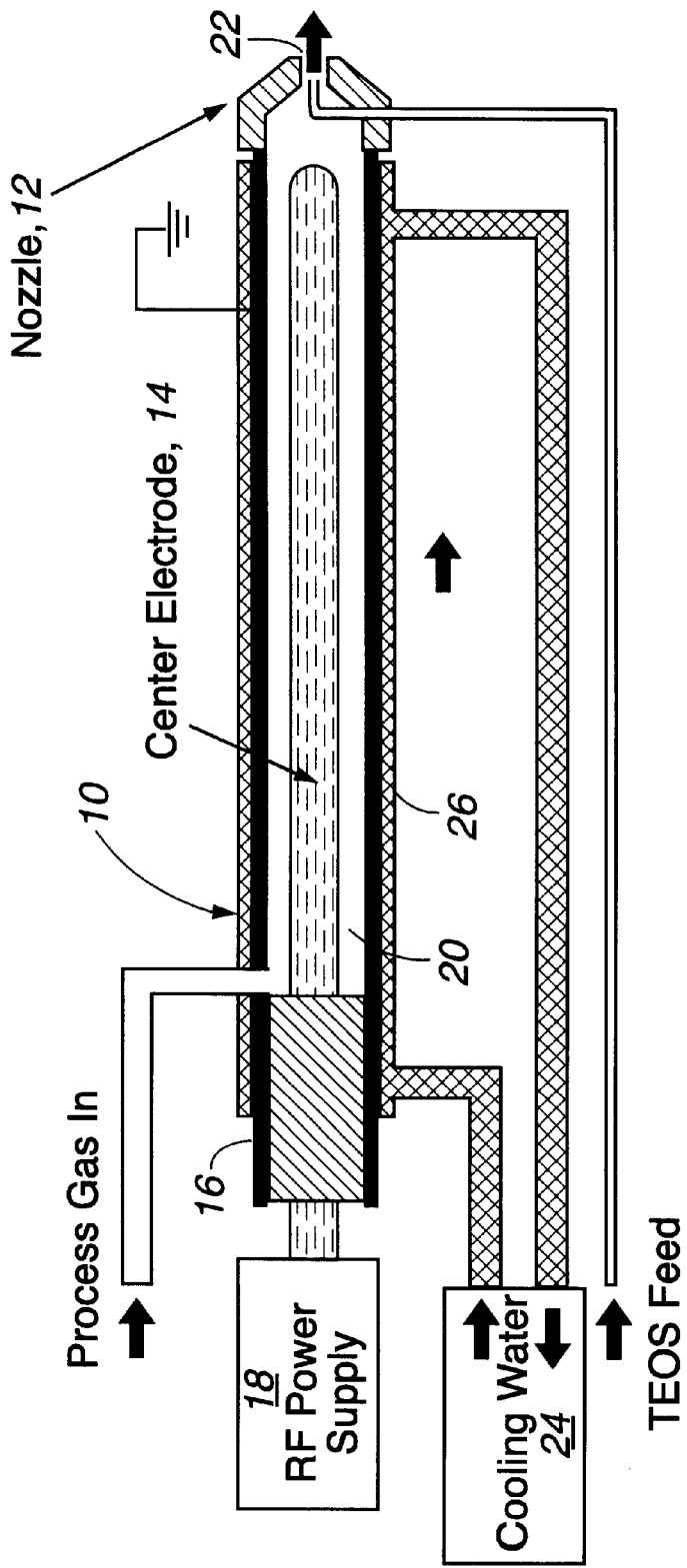
FIGS. 1a–c illustrate the atmospheric-pressure, plasma jet of the present invention, FIG. 1a showing a cross-sectional view thereof, with FIGS. 1b and 1c illustrating the side view and the axial cross section of the center electrode thereof.
Figure 1B:
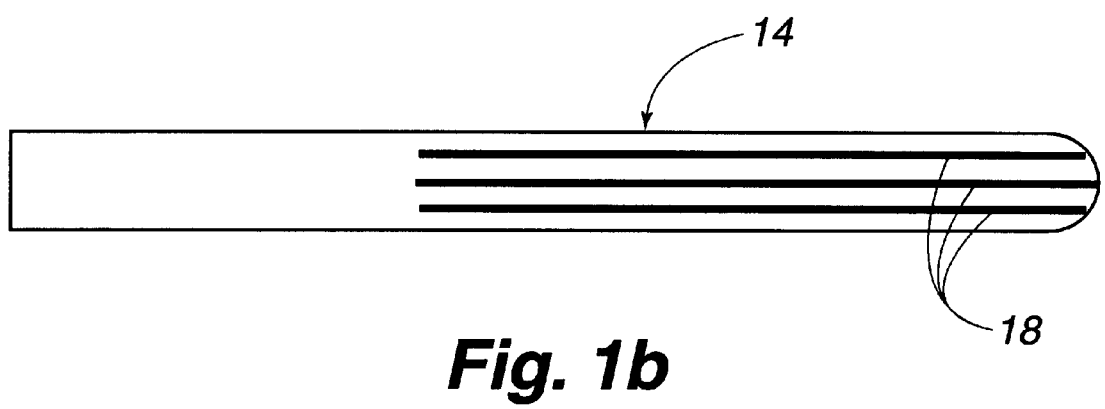
Figure 1C:
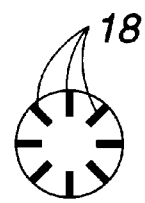

Reference will now be made in detail to the present preferred embodiments of the present invention, examples of which are illustrated in the accompanying drawings. Similar or identical structure is labeled using identical call outs. Turning now to the Figures, FIG. 1a is a schematic representation of a side view of one embodiment of the assembled APPJ, 10, of the present invention which is used to deposit silicon dioxide and other films onto substrates placed in front of nozzle, 12. The APPJ consists of two coaxial stainless steel electrodes, 14 and 16, outer electrode 16 forming a chamber having an open end for partially confining the plasma feed gas and the gaseous precursor species for the material to be deposited. FIGS. 1b and 1c are schematic representations of the side view and the axial cross section, respectively, of inner electrode 14 showing the longitudinally placed slots or flutes, 18, therein. In one embodiment, each identical flute has a width dimension and a depth dimension, typically between 0.02 and 0.1 in. It is preferred that the ratio of the width dimension to the depth dimension of the flutes is approximately one-to-three. The use of such slots has been found to produce enhanced plasma density without arcing over a broader operating region than when a fluteless, center electrode is employed; that is, the present apparatus can operate over a wider $He/O_2$ mixture range and at higher rf power without arcing when a fluted electrode is used, while a fluteless, inner electrode can be used over a more narrow range of operating conditions. Radiofrequency power at 13.56 MHz is applied to the inner electrode 14 using power supply, 18. Unlike atmospheric pressure glow discharges, the APPJ does not require a dielectric material between the electrodes to create a stable plasma. The inner (center) electrode 14 actually employed had a diameter of 0.50", while outer electrode 16 had an inner diameter of 0.62". Oxygen and helium (process gas) flow rates were measured with rotameters, and the gases were mixed before being introduced into the space, 20, between the two electrodes. The TEOS carrier gas, helium, was regulated by a mass flow controller. This carrier gas was bubbled through a reservoir of TEOS at a fixed temperature, and the resulting mixture was combined with the flowing plasma gases inside nozzle 12 located at the open end, 22, of jet 10. This nozzle directs the effluent flow onto the substrate (not shown in the Figures) to be coated. In the configuration shown in FIG. 1a, outer electrode 16 is grounded and cooled by flowing water from chiller, 24, through jacket, 26, in contact with the outer surface of the electrode.

The $SiO_2$ films were deposited on p-type silicon wafers which were placed 1 to 3 cm away from the nozzle. Prior to deposition, the silicon wafers were first cleaned in boiling sulfuric acid and subsequently immersed in dilute hydrofluoric acid for 30 seconds. After a thorough rinse, the substrates were placed on a sample holder disposed in front of the jet, and a temperature between 85 and 350° C. was chosen and maintained. Temperature measurements were made using a thermocouple placed 1 mm behind the sample surface. After the temperature had stabilized, the helium and oxygen flow rates were established, and the rf power between 75 W and 500 W was applied to the electrodes forming a stable discharge. Flow of the TEOS carrier gas was then initiated, allowing the TEOS/helium mixture to combine with the effluent stream. Unless otherwise noted, the standard process conditions were: $P_{He}$=757.2 torr, $P_{O_2}$=2.8 torr, $P_{TEOS}$=7.1 mtorr, total flow rate=49.4 L/min, $T_{substrate}$=115° C., nozzle to sample distance=1.7 cm, and rf power=280 W. After deposition, the films were analyzed to assess their quality.

Ozone concentrations were measured by an electrochemical gas monitor. The gas monitor was connected to a ¹⁄₁₆" stainless steel tube placed into the exiting gas stream (not shown in FIGS. 1a–c hereof. This allowed for continuous sampling of the effluent stream as the process conditions were changed. After deposition, the film composition was analyzed by infrared spectroscopy, the film thickness and the refractive index were measured by ellipsometry, and the surfaces were imaged by atomic force microscopy. The dielectric constant was also calculated from capacitance data by constructing a parallel plate capacitor of known plate area and separation.

Having generally described the invention, the following examples provide more detail:

EXAMPLE 1

Figure 2:
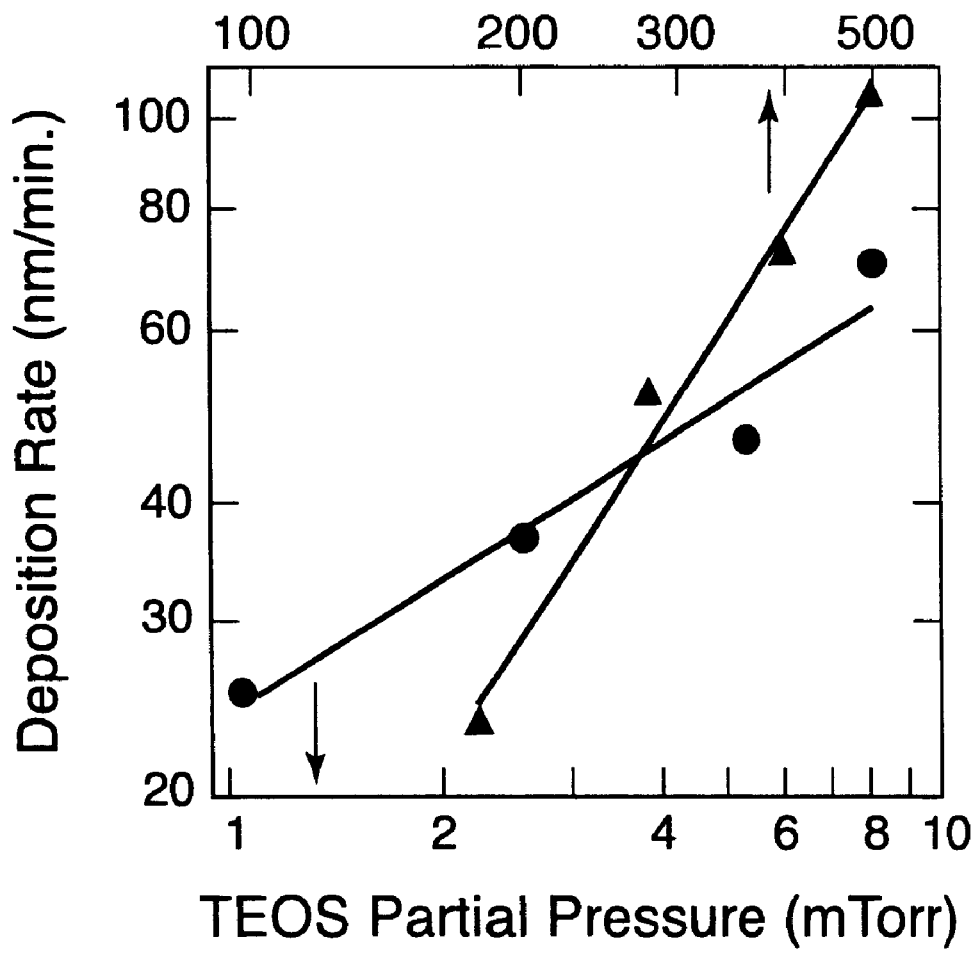
FIG. 2 shows the effect of rf power and TEOS partial pressure on the $SiO_2$ deposition rate.

The effects of the TEOS partial pressure and the rf power on the deposition rate are shown in FIG. 2. The TEOS partial pressure was varied from 1 to 8 mtorr and rf power levels were between 180 and 500 W. At an rf power of 500 watts, the temperature of the sample holder (not shown in FIGS. 1a–c hereof), which was located 1.5 cm away from the nozzle, was found not to rise above 115° C. This demonstrates the nonthermal nature of the APPJ. The log-log representation of the data shown in FIG. 2 indicates that the reaction order for the TEOS partial pressure is 0.47, whereas the reaction order for the rf power is 1.41. The reaction order for the rf power was found to be the largest of any process variable, while the second largest contribution to the deposition rate derives from the TEOS partial pressure. By increasing both the TEOS partial pressure to 0.2 torr and the rf power to 400 W, silica films were grown at 3020±250 Å/min. It is believed by the present inventors that this value may be limited by the small bubbler which can receive only 200 sccm of the carrier gas.

Figure 3:
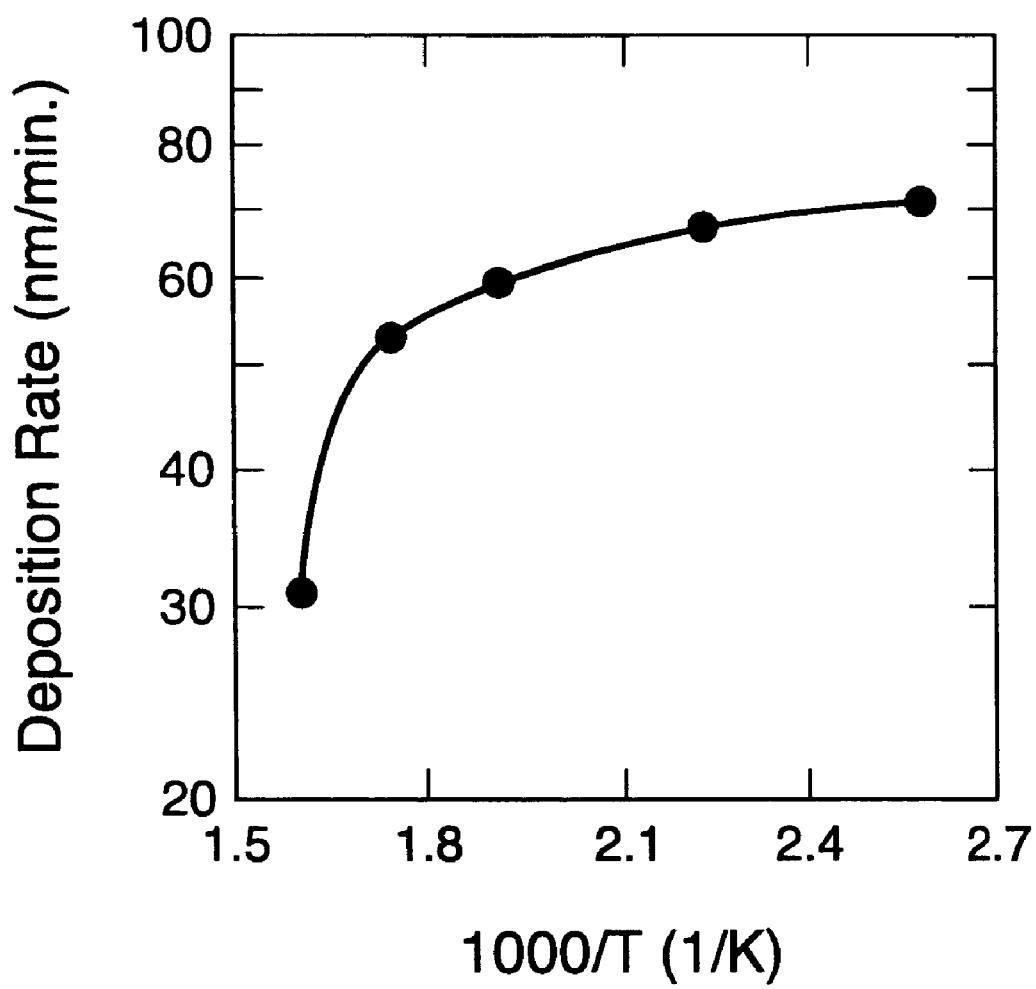
FIG. 3 shows the $SiO_2$ deposition rate as a function of substrate temperature.

An increase in the sample temperature with all other process conditions held constant shows a decrease in the deposition rate. Without additional heating of the sample, a temperature of 107° C. was maintained by the presence of the plasma at the standard operating conditions. A plot of the logarithm of the deposition rate as a function of 1000/T is shown in FIG. 3. The plot is not linear, indicating the departure from the Arrhenius form.

Figure 4:
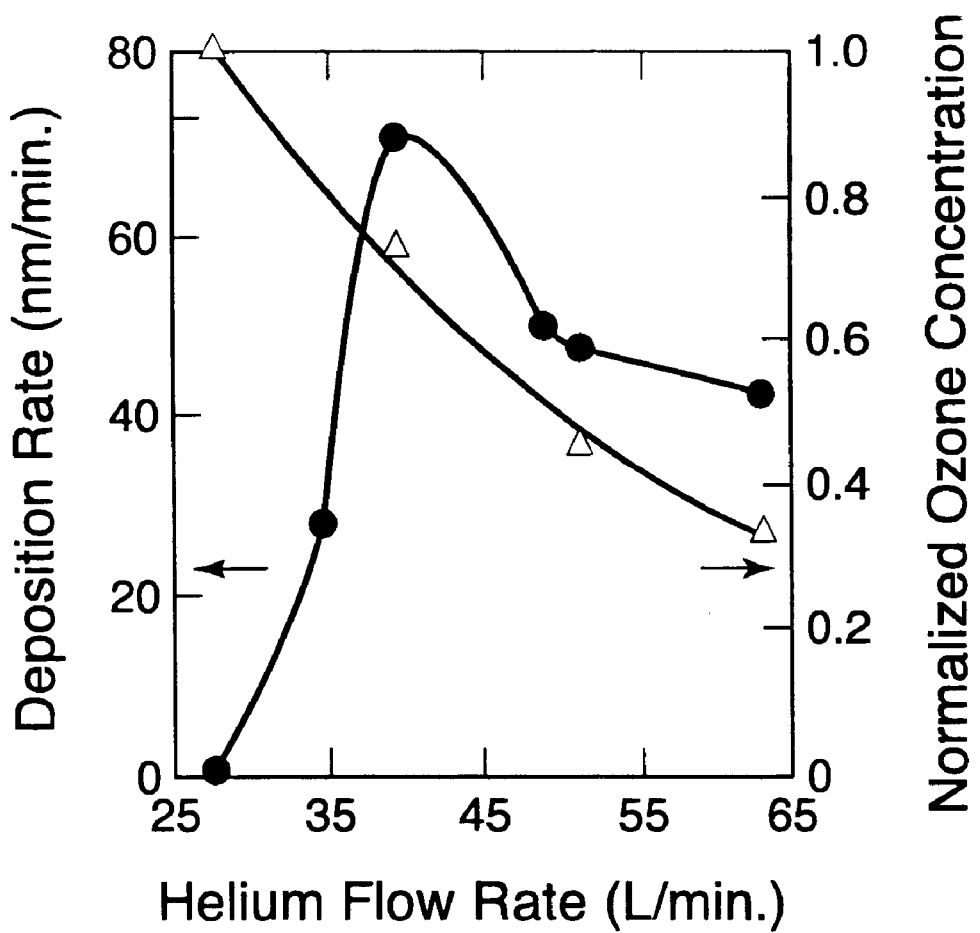
FIG. 4 shows the effect of helium flow rate on the deposition rate of $SiO_2$ and on the ozone concentration.

The gas mixture entering the APPJ is primarily composed of helium. The helium flow rate was typically 49 L/min. The effect of the deposition rate on the helium flow is shown in FIG. 4. A maximum is obviously present at 40.2 L/min. The decrease in ozone concentration with increasing helium flow rate is also shown in FIG. 4 for comparison. The deposition rate and ozone concentration as functions of helium flow rate show no correlation.

Figure 5:
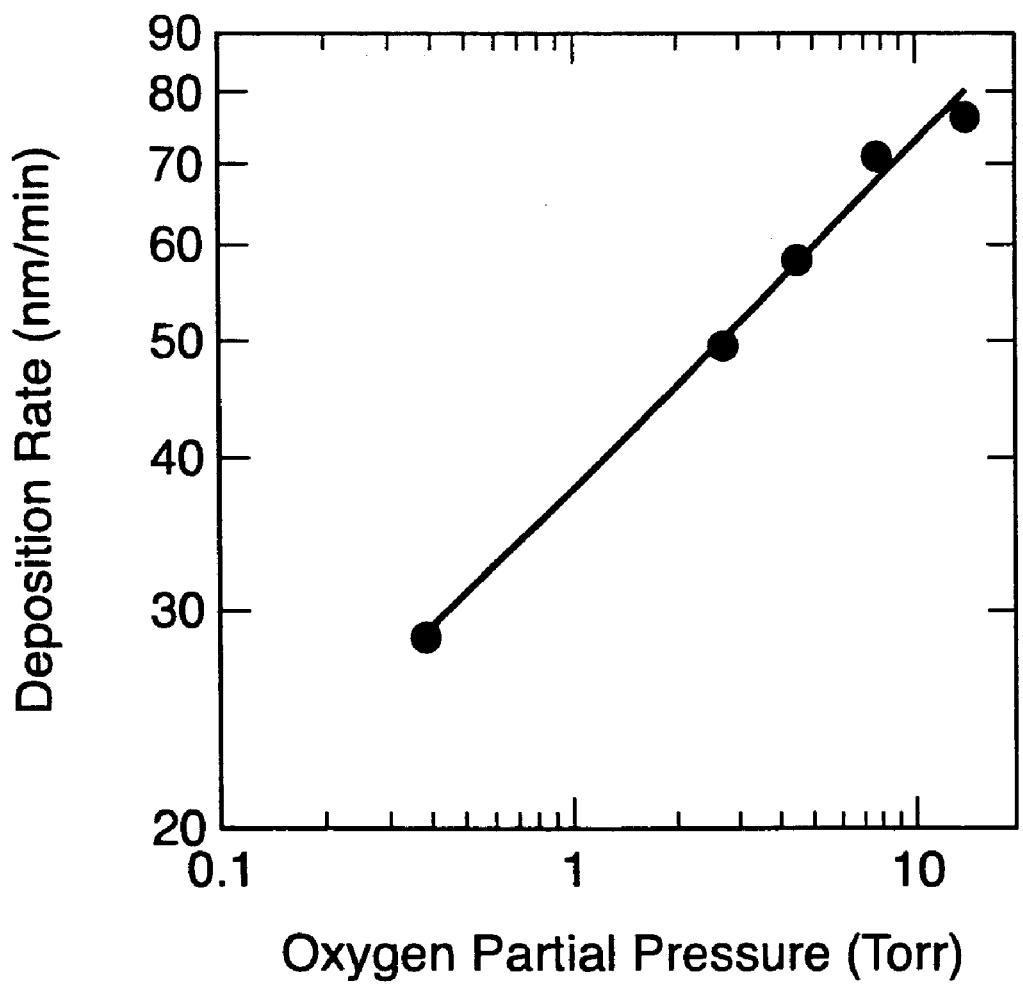
FIG. 5 shows the effect of oxygen partial pressure on the deposition rate.

FIG. 5 shows the effect of the oxygen partial pressure on the deposition rate. For this Figure, the oxygen was passed through the plasma jet. This data indicates that the reaction order for oxygen is 0.28. Oxygen must be present for the reaction to proceed. This differs from an atmospheric-pressure glow discharge which can deposit silicon dioxide in a helium plasma without the presence of oxygen. Introducing the oxygen through the nozzle only results in deposition rates that are less than one-tenth of the rates achieved when the same amount of oxygen is passed through the plasma jet.

Figure 6:
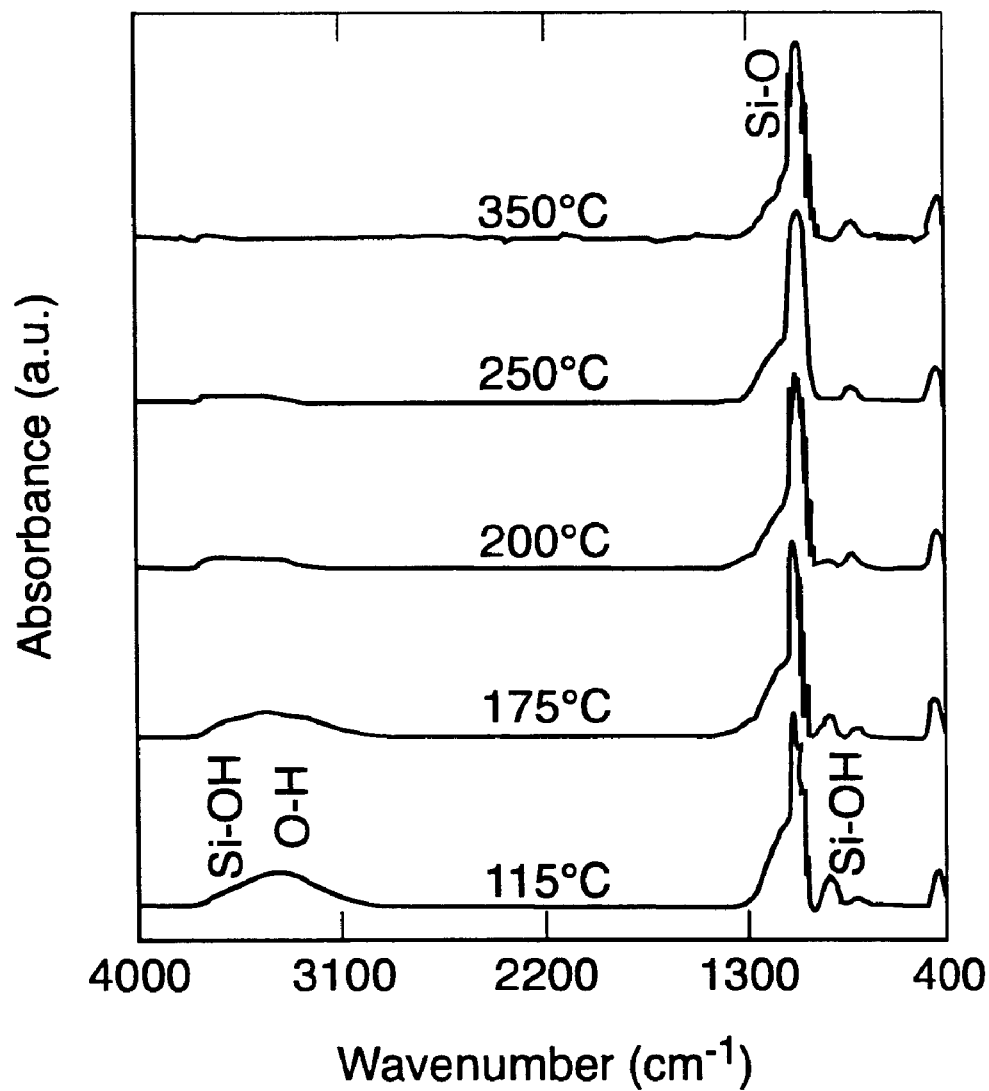
FIG. 6 shows FT-IR absorption spectra of $SiO_2$ films deposited at different substrate temperatures.

The infrared spectra in FIG. 6 show the effect of temperature on the film quality. The Si—O—Si asymmetric stretching, bending, and rocking modes are observed at 1080, 800, and 450 cm$^{-1}$, respectively. The absorption due to Si—O—H is observed at 3650 cm$^{-1}$. Hydrogen bonding between Si—O—H and $H_2O$ is observed at 3400 and 930 cm$^{-1}$. The peaks located at 3650, 3400, and 930 cm$^{-1}$ all decrease with increasing growth temperature. The CH stretching mode at 2900 cm$^{-1}$ and the C═O stretching mode at 1730 cm$^{-1}$ were not observed.

Figure 7:
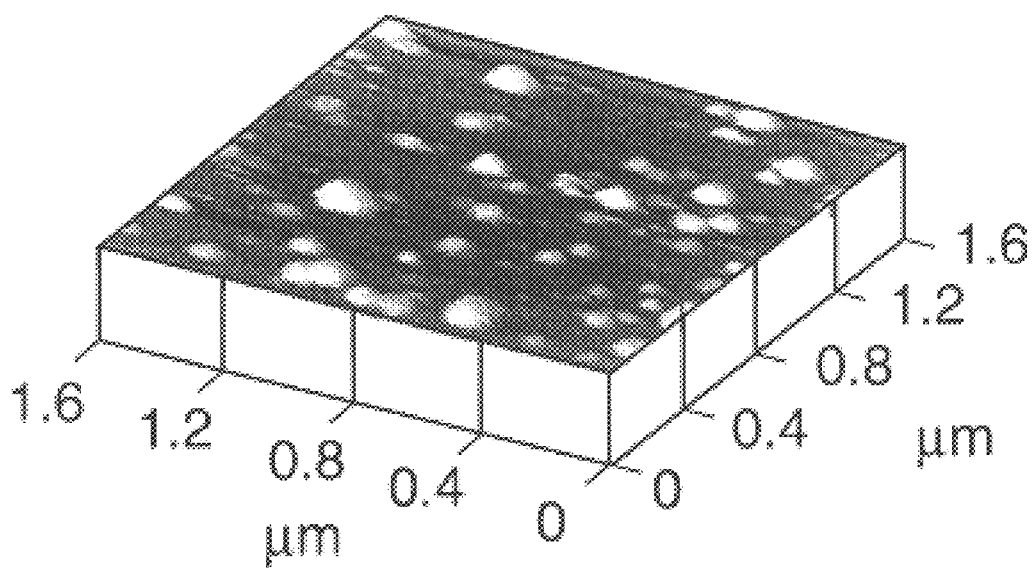
Figure 7:
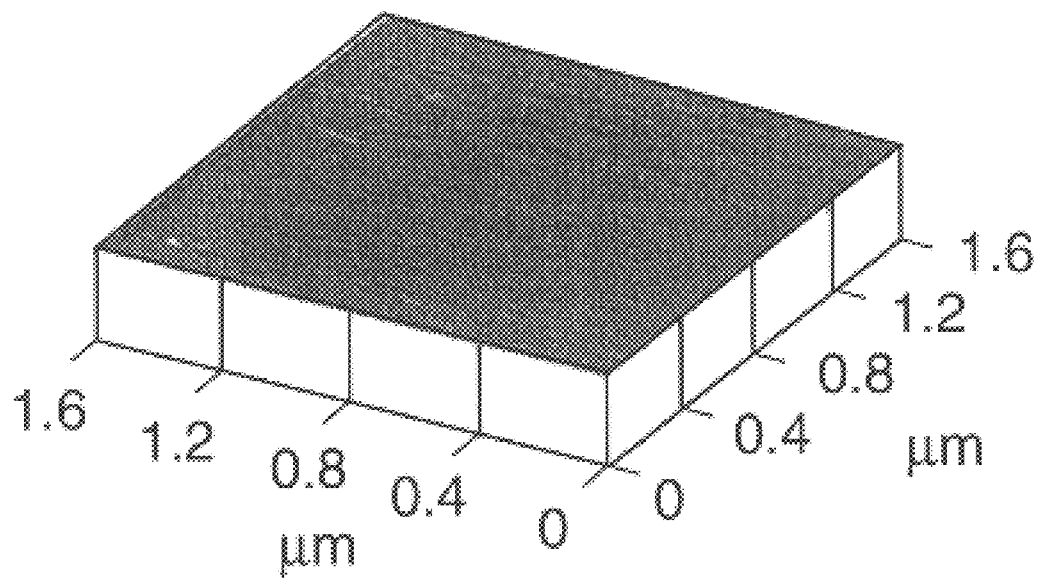

The films deposited at 115° C. have 0.1–0.3 µm circular features on the film surface. FIG. 7a shows an atomic force microscope image of such a surface. The white regions represent material protruding out of the plane of the deposited film. The peak-to-valley roughness is approximately 2300 Å. The z-axis is magnified by a factor of 5 to emphasize these surface features. FIG. 7b shows an atomic microscope image for a film deposited at 350° C. The surface is featureless. The peak-to-valley roughness is approximately 20 Å.

The refractive index, measured by ellipsometry, did not show a significant change from sample to sample. The square of the refractive index was 1.45±0.02 for most samples. To better asses the film quality, the dielectric constant was calculated from capacitance data for several films deposited by this process. From capacitance data, the dielectric constants were found to range from 5.0±0.2 for films deposited below 150° C. to 3.81±0.03 for films deposited at 350° C., indicating that excellent dielectric properties are attainable.

Both the high flow velocity and the use of helium, which limits ionization, prevent arcing in the APPJ. FIG. 4 shows that the deposition rate reaches a maximum with a helium flow rate of 40.2 L/min. Although the oxygen and TEOS partial pressures were not constant in FIG. 3, the maximum is a result of the balance between the production of reactive species in the plasma stream and the residence time of the TEOS in the plasma stream. Below this point, the number of reactive species produced within the plasma decreases.

The plasma can be sustained at approximately 40 watts of forward power. With the present APPJ design, application of an rf power exceeding 500 W generally produces arcing which can physically damage the electrodes. The large value of 1.41 for the slope of the log-log plot of the deposition rate as a function of the rf power confirms the strong dependence of the deposition rate on the amount of reactive species generated by the APPJ.

The dependence of the deposition rate on the helium flow rate, applied rf power, and TEOS flow rate all demonstrate that the deposition process is affected by gas-phase reactions in the plasma stream. However, upon increasing the substrate temperature, the deposition rate decreases substantially. Chemical vapor deposition using TEOS and oxygen is characterized by a negative activation energy. The deposition process is known to be exothermic. Additionally, increasing the substrate temperature will shift the adsorption equilibrium to the left. It is believed by the present inventors that the exothermic nature of the surface reaction and decrease in the effective adsorption of the TEOS on the substrate surface may contribute to the positive slope observed in FIG. 3. Films deposited at low temperatures are less dense. Since the deposition rate was measured from the film thickness, the deposition rate of these less-dense films will appear slightly higher than the more dense films grown at higher temperatures. This difference impacts the plot shown in FIG. 3 by slightly reducing the curvature.

As stated hereinabove, the APPJ effluent contains few ions. At atmospheric pressure, the ions are rapidly consumed upon exiting the annular space between the electrodes. Thus, helium metastables, oxygen atoms, ozone, or oxygen metastables are the only reactive species which could be responsible for the decomposition of the TEOS. It is believed by the present inventors that helium metastables are not directly responsible for the gas phase decomposition of the TEOS since deposition is not observed without the presence of oxygen. In a helium APG process, without the addition of oxygen, silicon dioxide is deposited using TEOS as both the silicon and oxygen source. The lack of correlation between the deposition rate and ozone concentration illustrated in FIG. 4 hereof indicates that ozone plays little, if any, role in the deposition process using the atmospheric pressure plasma jet.

The discussion set forth hereinabove suggests that metastable $O_2(b^1\Sigma_g^+)$ or $O_2(a^1\Delta_g^+)$, or oxygen atoms are responsible for the decomposition of TEOS which drives the deposition process. The ten-fold decrease in the deposition rate when oxygen is introduced only into the nozzle is evidence of the important role of metastable oxygen or oxygen atoms in the reaction mechanism.

Generally, increasing the temperature and incorporating $H_2$ into the gas stream increases the film quality by removing carbon and hydroxyl groups from the film. The increase in growth temperature reduces the hydroxyl concentration in the films, as may be observed from the infrared spectra of FIG. 6. The peaks located at 3650, 3400, and 930 cm$^{-1}$ all decrease with increasing deposition temperature. The CH and C=O stretching vibrations are not present in the infrared spectra collected for any of the films deposited. However, it should be mentioned that, upon addition of an amount as small as 0.25% of hydrogen, no deposition occurred even after 20 minutes.

Undesirable surface features were observed on the films deposited by the APPJ when the substrate temperature was maintained at 115° C. The AFM image shown in FIG. 7a reveals surface defects due to voids within the deposited silicon dioxide film. As shown in FIG. 7b, films deposited at 350° C. were smooth, suggesting the absence of voids. At low substrate temperatures, the energy supplied to the surface atoms is too small for significant surface migration. Therefore, the siloxane chains deposited on the substrate may not have sufficient time to arrange. Thus, a void can form around a protruding siloxane chain or cluster. At higher growth temperature, the surface migration prevents the voids from forming during deposition. In addition, the shoulder located at 1200 cm$^{-1}$, to the Si—O—Si asymmetric stretching mode increases with decreasing temperature as shown in FIG. 6. This may be caused by an increase in the porosity of the deposited films. Generally, the dielectric-screening effect reduces the vibration frequency. This effect is diminished near the surface of a large void. The Si—O—Si vibrations facing a large void or the film surface are not subject to the dielectric screening effect, and thus their vibrational frequency is not shifted.

The dielectric constant of silica generally obeys the equation $\epsilon=3.8073+2.72\times10^{-22}\times N$, where N is the concentration of hydroxyl ions per cubic centimeter. In the limit where no hydroxyl ions are present, such as in a thermally grown oxide, the dielectric constant will be 3.8073. The measured dielectric constants for the films deposited varied from 3.81±0.03 to 5.0±0.2, indicating hydroxyl concentrations of 9.93×10$^{18}$ and 4.38×10$^{21}$ hydroxyl ions per cubic centimeter, -respectively. The increase in the sample temperature promotes the desorption of H$_2$O produced in the formation of silicon dioxide from TEOS. However, the increase in temperature reduces the deposition rate. Thus, the deposition rate desired and the dielectric constant required for a particular application are balanced by the substrate temperature.

EXAMPLE 2

Suitable precursors for depositing a film containing a metal atom, M, are ML$_x$ (where L$_x$ is a ligand and x is the valence of the metal atom) compounds that are (a) volatile, (b) stable for transport to the nozzle, and (c) decompose without depositing impurities in the film. Suitable precursors may be identified by simple experimentation. Suitable volatile compounds are generally those containing short-chain alkyl groups and alkoxides mentioned hereinbelow. However, halogens (e.g., chlorides), amines, phosphines, and carbonyl ligands are often suitable.

The Table identifies other thin films that may be deposited with the plasma jet of the present invention. In all of these processes, helium will be introduced into the plasma. If an oxide is to be deposited, then O$_2$ is mixed with the helium and the mixture is passed through the plasma. If a nitride is to be deposited, then either N$_2$ or NH$_3$ will be mixed with the helium and the mixture passed through the plasma. If a carbide is to be deposited, then either acetylene or methane will be mixed with the helium and the mixture is passed through the plasma (other hydrocarbon gases, such as ethane, ethylene, etc. may be used as well).

For deposition of a pure elemental film, hydrogen may be passed through the plasma. The precursor containing the element to be deposited is always introduced into the nozzle following the plasma; otherwise, a film will be deposited on the electrodes and the plasma will extinguish. If an oxide film is to be deposited, then an alkoxide containing the element to be deposited will be introduced into the nozzle. Alkoxides have the general formula: M(OR)$_x$, where x is the number of alkoxide ligands which is equal to the valence of the metal atom, and R is an alkyl group attached to the oxygen atom. The alkyl group may include methyl, ethyl, n-propyl, isopropyl, n-butyl, isobutyl, tertiary butyl, allyl, vinyl, etc.

For depositing nitrides and carbides, an organometallic molecule containing the element to be deposited; i.e., MR$_x$, where x is equal to the valence of the metal, would be employed. The alkyl group, R, is the same as described above. For example, to deposit GaN, N$_2$ and He would be passed through the plasma, and He and Ga(CH$_3$) introduced into the nozzle. Here the R group would be a methyl ligand. Other gallium precursors could be used as well; for example, Ga(N(CH$_3$)$_2$)$_3$ may be employed.

TABLE

| Film | | Precursors and Gases Used |
|---|---|---|
| SiO$_2$ | Silicon Dioxide | Tetraethoxysilane (TEOS), TEOS/O$_2$, SiH$_4$/O$_2$, Si$_2$H$_6$/O$_2$, Si(NMe$_2$)$_4$/O$_2$ |
| GeO$_2$ | Germanium Dioxide | Ge(CH$_3$)$_4$/O$_2$, GeH$_4$/O$_2$, Ge(CH$_3$O)$_4$/O$_2$ |
| Al$_2$O$_3$ | Aluminum Oxide | Al(OC$_3$H$_7$)$_4$/O$_2$, Al(C$_2$H$_3$O)$_4$/O$_2$ |
| TiO$_2$ | Titanium Dioxide | Ti(C$_2$H$_5$O)$_4$/O$_2$, Ti(CH$_3$O)$_4$1O$_2$ |
| ci$_3$N$_4$ | Silicon Nitride | TEOS/N$_2$, SiH/N$_2$, TEOS/NH$_3$, SiH$_4$/NH$_3$, Si(NMe$_2$)$_4$/N$_2$ |
| BN | Boron Nitride | BF$_3$/N$_2$, BF$_3$/NH$_3$, B(C$_2$H$_5$)/N$_2$, B$_2$H$_4$/N$_2$, B$_2$H$_6$/NH$_3$ |
| GaN | Gallium Nitride | Ga(C$_2$H$_5$)$_3$/N$_2$, Ga(C$_4$H$_9$)$_2$/N$_2$, Ga(CH$_3$)$_3$/N$_2$, Ga(CH$_3$)$_3$/NH$_3$, |
| AlN | Aluminum Nitride | AlH$_3$N(CH$_3$)$_2$/N$_2$, Al(CH$_3$)$_3$/N$_2$, AlH(CH$_3$)$_2$/N$_2$, Al(CH$_3$)$_3$NH$_3$ |
| TiN | Titanium Nitride | Ti(NMe$_2$)$_4$, Ti(NMe$_2$)$_4$/N$_2$, Ti(NMe$_2$)$_4$/NH$_3$, TiCl$_4$/NH$_3$ |
| InN | Indium Nitride | In(CH$_3$)$_3$/N$_2$, In(C$_2$H$_5$)$_3$/N$_2$, In(CH$_3$)$_3$/NH$_3$, In(C$_3$H$_5$)$_3$/NH$_3$, |
| WN$_x$ | Tungsten Nitride | WCl$_6$/N$_2$, WCl$_6$INH$_3$, W(CO)$_6$/NH$_3$, W(CO)$_6$/N$_2$ |
| SiO$_{2-x}$F$_2$x | Silicon oxy-fluoride | TEOS/O$_2$/F$_2$, SiH$_4$/O$_2$/F$_2$, Si$_2$H$_6$O$_2$/F$_2$ |
| SiO$_{2-x}$N$_2$/$_3$x | Silicon oxy-nitride | TEOS/N$_2$/O$_2$, SiH$_4$/N$_2$/O$_2$,Si(NMe$_2$)$_4$/O$_2$ |
| SiC | Silicon Carbide | SiH(C$_2$H$_5$)$_3$/C$_2$H$_2$, SiH$_4$/C$_2$H$_2$, Si$_2$H$_6$C$_2$H$_2$, SiH$_4$/CH$_4$ |
| TiC | Titanium Carbide | Ti(NMe$_2$)$_4$/C$_2$H$_2$, Ti(NMe$_2$)$_4$/CH$_4$, TiCl$_4$/CH$_4$ |
| WC$_x$ | Tungsten Carbide | WCl$_6$/C$_2$H$_2$, WCl$_6$CH$_4$, W(CO)$_6$, W(CO)$_6$/C$_2$H$_2$ |
| C | Diamond | CH$_4$, C$_2$H$_6$, C$_2$H$_4$, C$_2$H$_2$ |

TABLE-continued

| | Film | Precursors and Gases Used |
|---|---|---|
| Si[#] | Silicon[#] | $SiH_4$, $Si_2H_6$, $SiH_4/H_2$, $Si_2H_6/H_2$ |
| Cu | Copper | $Cu(OCH_2CH_2NMe_2)_2$, $Cu(OCH_2CH_2)_2$ |
| Al | Aluminum | $AlH_3N(CH_3)_2/H_2$, $Al(CH_3)_3/H_2$, |
| W | Tungsten | $WCl_6/H_2$, $W(CO)_6/H_2$ |

[#]Polycrystalline silicon, or amorphous hydrogenated silicon.

Other films that can be deposited include metal phosphides (MP, e.g., BP, GaP, AlP, etc.) and metal arsenides (MAs, e.g., AlAs, GaAs, InAs, etc.). These films might be deposited as polycrystalline or amorphous hydrogenated layers. Precursors for zirconium nitride and carbide (ZrN, ZrC) may be identified by substituting Zr for Ti in the compounds in the right-hand column of the TABLE, since zirconium is in the same row of the Periodic Table as titanium. Similarly, precursors for tantalum nitride and carbide ($TaN_x$ and $TaC_x$) may be identified by substitution of Ta for W in the right-hand column of the TABLE. However, since Ta is in the next row to the left of W in the Periodic Table, the same ligands may be used as those for W, except that one fewer ligand would be required; e.g., $Ta(CO)_5$.

The range of deposition temperatures is 100 to 1000° C., with a preferable range of 250 to 500° C.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for depositing a material onto a substrate, comprising the steps of:

(a) generating at least one reactive species in an arcless, atmospheric-pressure, RF plasma discharge in a gas flowing through an annular region between an electrically conducting chamber having a closed end and an open end and a metal electrode located within the chamber and disposed such that the annular region is defined therebetween, whereby said at least one reactive species [flow] flows toward the open end of the chamber;

(b) introducing a gaseous precursor species of said material into said at least one reactive species within the chamber in the region of the open end thereof and outside of the plasma discharge, said gaseous precursor species being chosen such that said precursor species reacts with at least one of said at least one reactive species, whereby a gaseous jet capable of forming said material exits through the open end of the chamber; and (c) placing said substrate in the path of the gaseous jet, whereby said material is deposited on said substrate.

2. The method for depositing a material onto a substrate as described in claim 1, whereby substantially all ions generated in the atmospheric-pressure, plasma discharge are consumed therein in the region where the gaseous jet exits the open end of the chamber.

3. The method for depositing a material onto a substrate as described in claim 1, wherein said flowing gas includes an $O_2$/He mixture.

4. The method for depositing a material onto a substrate as described in claim 3, wherein said gaseous precursor species includes tetraethoxysilane, and said material is $SiO_2$.

5. The method for depositing a material onto a substrate as described in claim 3, wherein said substrate is silicon.

6. The method for depositing a material onto a substrate as described in claim 3, wherein 13.56 MHz rf energy is applied to the electrode, and the electrically conducting chamber is grounded.

* * * * *